United States Patent
Takahashi (10) Patent No.: US 7,615,993 B2
(45) Date of Patent: *Nov. 10, 2009

(54) MAGNETIC LINE-TYPE POSITION-ANGLE DETECTING DEVICE

(75) Inventor: Toru Takahashi, Iwata (JP)

(73) Assignee: NTN Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/635,542

(22) Filed: Dec. 8, 2006

(65) Prior Publication Data

US 2007/0145970 A1    Jun. 28, 2007

(30) Foreign Application Priority Data

Dec. 27, 2005 (JP) ............... 2005-374209
Dec. 27, 2005 (JP) ............... 2005-374210
Dec. 27, 2005 (JP) ............... 2005-374265

(51) Int. Cl.
 *G01B 7/14* (2006.01)
 *G01B 7/30* (2006.01)

(52) U.S. Cl. ............... 324/207.24; 324/207.25; 324/174

(58) Field of Classification Search ............... 324/207.11–207.26, 173–174, 166, 251, 324/252

See application file for complete search history.

(56) References Cited

U.S. PATENT DOCUMENTS

| | | | | |
|---|---|---|---|---|
| 5,589,769 A | * | 12/1996 | Krahn | 324/207.26 |
| 6,307,365 B1 | * | 10/2001 | Santos et al. | 324/207.12 |
| 6,509,732 B1 | * | 1/2003 | Rhodes et al. | 324/207.12 |
| 7,050,917 B2 | * | 5/2006 | Schroeder | 702/104 |
| 7,263,781 B2 | * | 9/2007 | Sielemann | 33/708 |
| 2004/0150393 A1 | * | 8/2004 | Lequesne et al. | 324/207.21 |
| 2007/0063696 A1 | * | 3/2007 | Takahashi | 324/207.25 |

FOREIGN PATENT DOCUMENTS

JP    2003-148999    5/2003

* cited by examiner

*Primary Examiner*—Reena Aurora (57) ABSTRACT

To provide a magnetic line-type position-angle detecting device capable of detecting an absolute position on a non-contact basis and with high resolution and inexpensive construction, the magnetic line-type position-angle detecting device includes a magnetic line sensor 1 having a plurality of magnetic sensor elements 1a arranged in line, and a magnetic generating element 2 confronting the magnetic line sensor and movable in a direction conforming to the line of the magnetic sensor elements 1a. The magnetic sensor elements 1a of the magnetic line sensor 1 are sequentially selected by a scanning circuit 3, a signal from the selected sensor element 1a is processed into a digital signal through an amplifier 4, and an analog-to-digital converting circuit 5. By a calculation processing circuit 6, a distribution of magnetic fields applied to the magnetic line sensor 1 are measured to calculate the position and/or angle of the magnetic generating element 2.

8 Claims, 8 Drawing Sheets

MAGNETIC LINE-TYPE POSITION-ANGLE DETECTING DEVICE

BACKGROUND OF THE INVENTION

1. Field of the Invention

The present invention relates to a position-angle detection device of a magnetic line-type, which is used in various machines and equipments for detecting the position.

2. Description of the Prior Art

Hitherto, for detecting the position on a non-contact basis, various sensors of optical, electrostatic capacitance detecting and magnetic types are used.

It is to be noted that for detecting the rotation of various machines and equipments, the device has been suggested, in which a magnetic sensor array is constructed with a plurality of magnetic sensor elements arranged in a matrix pattern and is arranged in face-to-face relation with a magnet, arranged on a rotatable member, so as to detect a distribution of magnetic fields generated by the magnet, so that the angle of rotation of the magnet can be detected from the detected distribution of the magnetic fields. (See, for example, the Japanese Laid-open Patent Publication No. 2003-148999, published May 21, 2003.)

The position sensors of the optical, electrostatic capacitance detecting and magnetic types referred to above involves various problems in that they are expensive, require adjustments and are capable of only detecting a relative displacement.

SUMMARY OF THE INVENTION

An object of the present invention is to provide a magnetic line-type position-angle detecting device capable of detecting the absolute position on a non-contact basis and with high resolution and, also, capable of being inexpensively constructed.

The magnetic line-type position-angle detecting device according to the present invention includes a magnetic line sensor having a plurality of magnetic sensor elements arranged in a linear array, a magnetic generating element held in face-to-face relation with the magnetic line sensor and movable along the magnetic line sensor in a direction conforming to the direction in which the magnetic sensor elements are deployed, a scanning circuit for sequentially selecting one of the magnetic sensor elements of the magnetic line sensor, an amplifier for amplifying a signal outputted from the selected sensor element, an analog-to-digital converting circuit for converting an output from the amplifier into a digital signal, and a calculation processing circuit for evaluating a distribution of magnetic fields, applied to the magnetic line sensor, in reference to an output of the analog-to-digital converting circuit to thereby calculate a position of the magnetic generating element.

The magnetic generating element referred to above may include a magnet having a pair of N and S magnetic poles confronting the magnetic line sensor, and the calculation processing circuit referred to above may be of a type capable of detecting the position of the magnetic generating element in reference to a waveform of a sensor signal obtained from the output of the analog-to-digital converting circuit.

The calculation processing circuit referred to above may be of a type capable of detecting a zero-crossing position of a waveform of a sensor signal outputted from the analog-to-digital converting circuit. Also, the calculation processing circuit may be of a type capable of converting the zero-crossing position into an actual position of the magnetic generating element to thereby calculate and output an absolute position.

In this magnetic line-type position-angle detecting device, magnetic fields generated from the magnetic generating element are applied to the magnetic line sensor and the magnetic sensor elements then detect the applied magnetisms, respectively. Each of the magnetic sensor element of the magnetic line sensor is sequentially selected by the scanning circuit, a detection signal of the selected magnetic sensor element is then amplified by the amplifier, and an output of the amplifier is subsequently converted into a digital signal by the analog-to-digital (AD) converting circuit. In the calculation processing circuit, the zero-crossing position is determined from a plurality of detection signals in the vicinity of a boundary position (the zero-crossing position) of the magnetic poles in the distribution of the magnetic fields, generated by the magnetic generating element, by means of a collinear approximation so that this zero-crossing position can be calculated as the position of the magnetic generating element. In this way, the position of the magnetic generating element moving linearly can be detected as the absolute position on a non-contact basis with avoiding frictional wear.

As described above, when the zero-crossing position is determined by means of the collinear approximation of a plurality of signals in the vicinity of zero out from the detection signals outputted from the magnetic line sensor, the position of the magnetic generating element can be detected with higher resolution than the array pitch of the magnetic sensor elements of the magnetic line sensor and without being affected by the absolute value (intensity) of the magnetic field strength. Also, since the collinear approximation is calculated using the plurality of the detection signals in the vicinity of the zero, noise components contained in those detection signals can be averaged, bringing about such an effect as to render it to be hardly affected by noises.

In the present invention, there may be provided four magnetic line sensors and the magnetic line sensors may be arranged in a square form and the calculation processing circuit may be of a type capable of detecting the angle and the position of the magnetic generating element simultaneously. In the case of this construction, a structure for detecting a rotation and a linear movement of the magnetic generating element can be realized inexpensively and with space-saving.

In the present invention, the magnetic generating element may have two polar boundaries in a direction in which the sensor elements of the magnetic line sensor are arranged.

The calculation processing circuit referred to above may be of a type capable of detecting the position of the magnetic generating element by detecting two zero-crossing positions obtained from a waveform of the sensor signal outputted from the AD converting circuit. Also, the calculation processing circuit referred to above may be of a type capable of determining an intermediate point from the two detected zero-crossing positions for outputting the detected position of the magnetic generating element. In the case of this construction, it is possible to render the detection of the position of the magnetic generating element to be hardly affected by external magnetic fields and the precision of the angle detection can correspondingly be increased.

In this magnetic line-type position-angle detecting device, magnetic fields generated from the magnetic generating element are applied to the magnetic line sensor and the magnetic sensor elements then detect the applied magnetisms, respectively. Each of the magnetic sensor elements of the magnetic line sensor is sequentially selected by the scanning circuit, a detection signal of the selected magnetic sensor element is then amplified by the amplifier, and an output of the amplifier is subsequently converted into a digital signal by the analog-to-digital (AD) converting circuit. In the calculation processing circuit, two zero-crossing positions are determined from a plurality of detection signals in the vicinity of a position of two magnetic polar boundaries (the zero-crossing positions) in the distribution of the magnetic fields, generated by the magnetic generating element, by means of, for example, a collinear approximation, and an intermediate point of the determined two zero-crossing positions is then calculated so that the intermediate point can be outputted as the position of the magnetic generating element. In this way, the position of the magnetic generating element moving linearly can be detected as the absolute position on a non-contact basis while avoiding frictional wear.

When a disturbing magnetic field is generated, a waveform of the detection signal shifts in a direction of the disturbing field, resulting in that the two zero-crossing positions shift in respective opposite directions by an equal distance. Accordingly, the intermediate point of the two zero-crossing positions does not change even after the shifts of the zero-crossing position. In other words, the position calculated by the calculation processing circuit is not affected by the disturbing magnetic field.

As described above, when the zero-crossing position is determined by means of the collinear approximation of a plurality of signals in the vicinity of zero out from the detection signals outputted from the magnetic line sensor, the position of the magnetic generating element can be detected with higher resolution than the array pitch of the magnetic sensor elements of the magnetic line sensor and without being affected by the absolute value (intensity) of the magnetic field strength. Also, since the collinear approximation is calculated using the plurality of the detection signals in the vicinity of the zero, noise components contained in those detection signals can be averaged, bringing about such an effect as to render it to be hardly affected by noises.

In the present invention, the magnetic line-type position-angle detecting device may be of a structure, in which the magnetic generating element is angularly movable generally along the magnetic line sensor in a direction, conforming to the direction in which the magnetic sensor elements are deployed, on an arcuate path about a predetermined rotation axis, and the calculation processing circuit is capable of measuring a distribution of magnetic fields applied to the magnetic line sensor for detecting the position of the magnetic generating element above the line sensor, and capable of determining from the detected position, an angle at which the magnetic generating element is positioned about the rotation axis, that is, a magnetic line-type position-angle detecting device.

The magnetic line-type position-angle detecting device referred to above may include an integrated circuit of a silicon chip. Also, the calculation processing circuit may include a parameter storage for storing such parameters as a distance of arrangement of the magnetic generating element from the rotation axis and a position of origin of the angle of the magnetic generating element, and the parameters to be stored in the parameter storage can be set from outside of the calculation processing circuit.

Also, the calculation processing circuit may be capable of detecting the position of the magnetic generating element above the magnetic line sensor, by utilizing the parameters stored in the parameter storage, to thereby calculate an absolute angle from the detected position data.

In this magnetic line-type position-angle detecting device, magnetic fields from the magnetic generating element are applied to the magnetic line sensor and the magnetic sensor elements detects the magnetic fields then applied to the magnetic line sensor. At this time, the magnetic sensor elements are sequentially selected one after another by the scanning circuit, and a detection signal from the selected magnetic sensor element is amplified by the amplifier, before an output of the amplifier is converted by the AD converting circuit into a digital signal. In the calculation processing circuit, the zero-crossing position is determined by performing, for example, a collinear approximation from a plurality of detection signals in the vicinity of a magnetic pole boundary (a zero-crossing position) in the distribution of the magnetic fields from the magnetic generating element and this zero-crossing position is outputted as the position of the magnetic generating element. Also, the calculation processing circuit determines the angle of the magnetic generating element about the swinging axis from the position of the magnetic generating element, detected at a position of origin of a swinging motion. Thereby, the angle of the magnetic generating element can be detected on a non-contact basis with no frictional wear and with higher resolution than the array pitch of the magnetic sensor elements of the magnetic line sensor. Since the swing angle of the magnetic generating element is determined by such calculation processing, the minute angle can be detected with high precision when the distance from the position of the magnetic generating element, detected at the position of the origin of swing to the swinging axis is increased. It is, however, to be noted that increase of the above discussed distance may reduce the range of angle that can be detected and, therefore, this magnetic line-type position-angle detecting device is particularly suited to the detection with high resolution within a certain range of angle.

For component parts of this magnetic line-type position-angle detecting device, the magnetic generating element, the silicon chip having the magnetic line sensor and the various signal processing circuits integrated thereon, a circuit substrate attendant to the silicon chip and casings are sufficient and the number of the component parts used is therefore small and, since no external correcting circuit is needed, the structure can be constructed simple and compact.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DETAILED DESCRIPTION OF THE EMBODIMENTS

Figure 1:
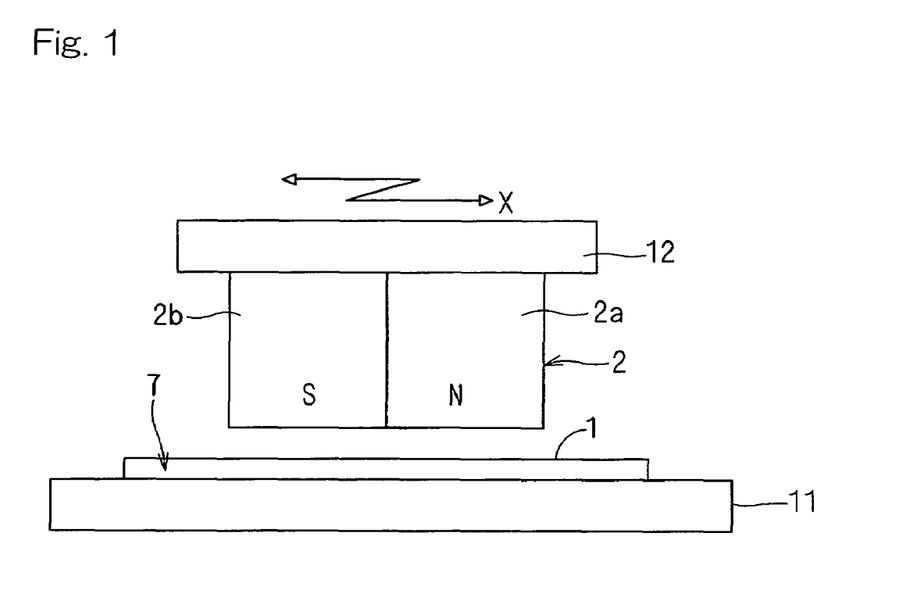
FIG. 1 is a front elevational view showing a basic structure of a magnetic line-type position-angle detecting device according to a first preferred embodiment of the present invention.

A first preferred embodiment of the present invention will be described in detail with particular reference to FIGS. 1 to 5. FIG. 1 illustrates a basic structure of a magnetic line-type position-angle detecting device according to this first embodiment. This magnetic line-type position-angle detecting device includes a sensor chip 7 having a magnetic line sensor 1 (FIG. 2B), and a magnetic generating element 2 held in face-to-face relation with the magnetic line sensor 1 spacedly on a non-contact basis and movable in a direction X, in which sensor elements of the magnetic line sensor 1 are arrayed. The sensor chip 7 is fixed to a stationary side member 11 whereas the magnetic generating element 2 is fixed to a movable side member 12 capable of linearly moving in parallel to the longitudinal direction of the sensor chip 7.

Figures 2A, 2B:
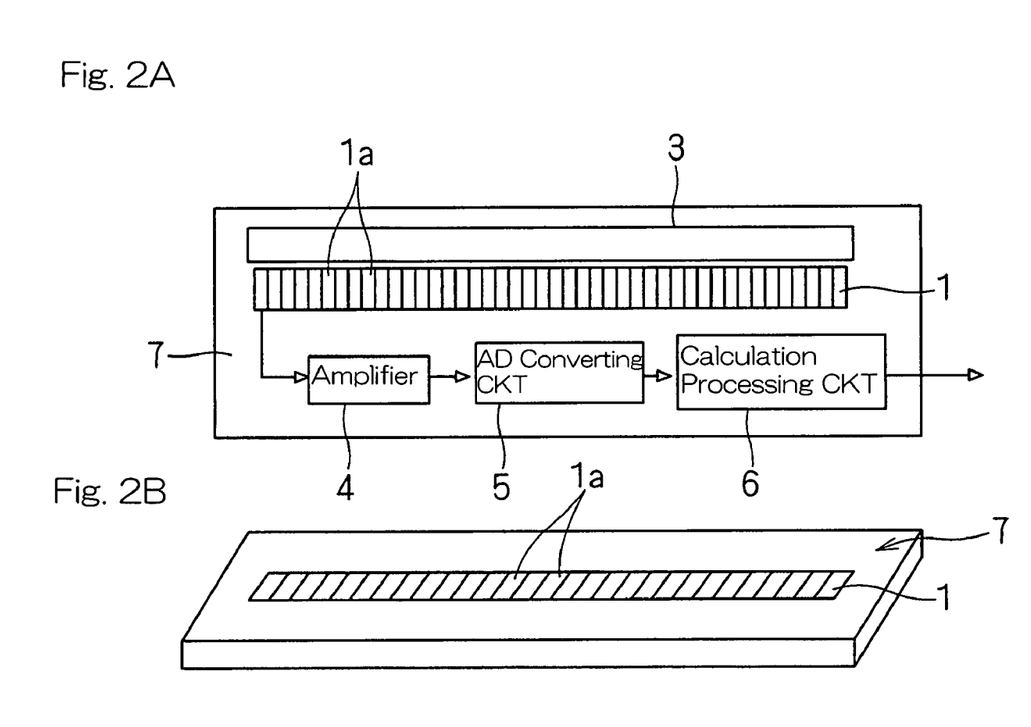
FIG. 2A is a plan view of a sensor chip used in the magnetic line-type position-angle detecting device in FIG. 1.
FIG. 2B is a perspective view of the sensor chip in FIG. 2A.

The magnetic line sensor 1 is a sensor operable to detect magnetism of the magnetic generating element 2 and is made up of a plurality of sensor elements 1a arrayed in line on a surface of the single sensor chip 7 as shown in FIG. 2B. As shown in FIG. 2A, the sensor chip 7 includes a scanning circuit 3 for sequentially selecting one of the magnetic sensor elements 1a of the magnetic line sensor 1, an amplifier 4 for amplifying a signal from the selected magnetic sensor element 1a, an analog-to-digital (AD) converting circuit 5 for converting an output of the amplifier 4 to a digital signal, and a calculation processing circuit 6 for evaluating a distribution of magnetic fields, applied to the magnetic line sensor 1, based on the converted signal from AD converting circuit 5 to thereby calculate the position of the magnetic generating element 2, all of those elements being integrated on the sensor chip 7 together with the magnetic line sensor 1.

Figure 3:
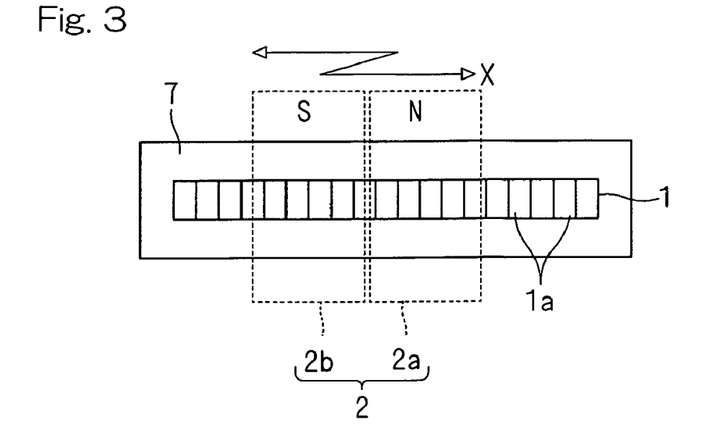
FIG. 3 is a plan view showing a relation in position between a magnetic generating element and a magnetic line sensor in the magnetic line-type position-angle detecting device in FIG. 1.

As shown in FIG. 1, the magnetic generating element 2 is in the form of a magnet held in face-to-face relation with the magnetic line sensor 1 and having a pair of N and S magnetic poles 2a and 2b juxtaposed in the direction X, in which the sensor elements are arranged in line. In FIG. 3, the relation in position between the magnetic line sensor 1 and the magnetic generating element 2 is shown in a plan view.

Hereinafter, the operation of the magnetic line-type position-angle detecting device of the structure described above will be described. In a condition, in which the magnetic generating element 2 is held in, for example, such a relation in position as shown in FIG. 3 relative to the magnetic line sensor 1, a vertical component of magnetic fields generated from the magnetic generating element 2 in a direction perpendicular to the sensor chip 7 is applied to the magnetic line sensor 1 and each of the magnetic sensor elements 1a then detects the magnetic fields so applied. The magnetic sensor elements 1a of the magnetic line sensor 1 are sequentially selected one after another by the scanning circuit 3, and a detection signal from the selected magnetic sensor element 1a is amplified by the amplifier 4, before the output of the amplifier 4 is converted by the AD converting circuit 5 into a digital signal.

Figure 4:
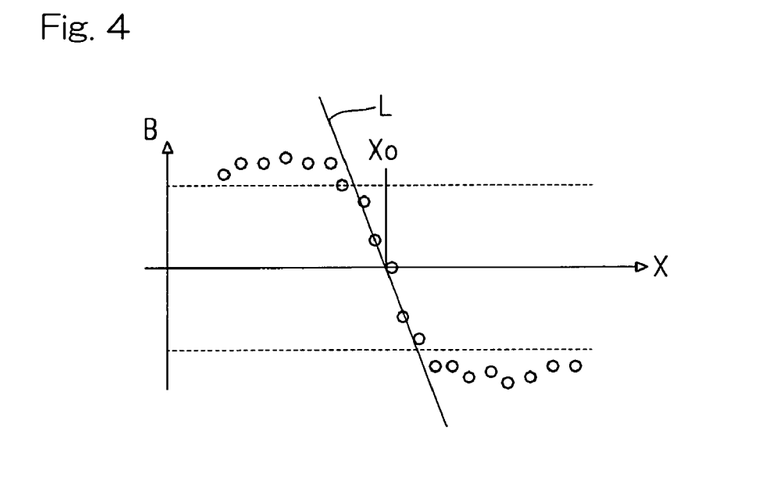
FIG. 4 illustrates a waveform obtained by plotting detection signals from the magnetic line sensor in the magnetic line-type position-angle detecting device in FIG. 1, which are arranged in the order of reading of those detection signals.

FIG. 4 is a chart, in which respective detection signals of the magnetic sensor elements 1a obtained through such a signal processing as described above are plotted in the order of reading of those detection signals, which corresponds to a distribution of the magnetic fields generated by the magnetic generating element 2. In this figure, a portion of the waveform on a positive (+) area corresponds to the magnetic field emanating from the S magnetic pole 2b of the magnetic generating element 2, whereas a portion of the waveform on a negative (−) area corresponds to the magnetic field emanating from the N magnetic pole 2a of the magnetic generating element 2. A detection signal in the vicinity of a boundary position (zero-crossing position) X0 between the N and S magnetic poles 2a and 2b approximates to a zero output since the vertical component of the magnetic fields applied there is zero. In the calculation processing circuit 6, the zero-crossing position X0 is calculated from the plural detection signals in the vicinity of zero by means of a collinear approximation as shown by a linear line L in FIG. 4 and the zero-crossing position X0 so calculated is then determined as the position of the magnetic generating element 2. For the above described collinear approximation, the least square method or the like can be employed.

Since the position X0 of the magnetic generating element 2 so calculated is the absolute position on the magnetic line sensor 1, no operation to ascertain the point of origin is needed and the current position can be detected immediately after the electric power-on operation. By determining the zero-crossing position X0 through such a calculating process, the position X0 of the magnetic generating element 2 can be detected with higher resolution than the array pitch of the magnetic sensor elements 1a of the magnetic line sensor 1 and without being affected by the sensitivity deviation of the magnetic sensor elements 1a and the absolute value (intensity) of the magnetic field strength. Also, noise components contained in those detection signals can be averaged and, therefore, an effect of rendering it to be hardly affected by noises can also be obtained.

Figure 5:
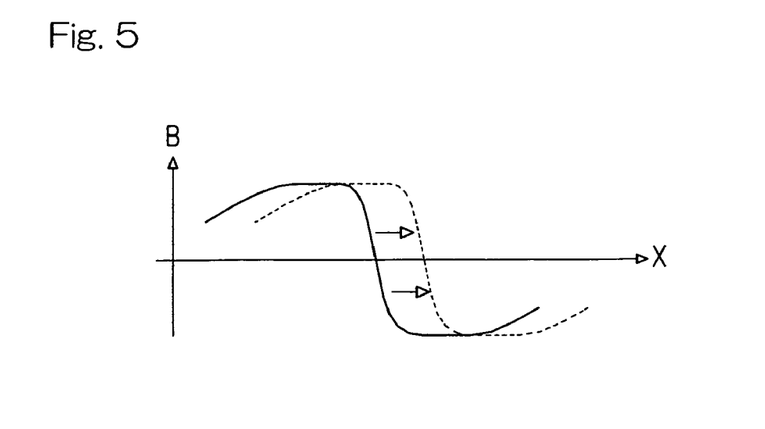
FIG. 5 illustrates a waveform descriptive of a change of the waveform of the detection signal, obtained by the magnetic line-type position-angle detecting device in FIG. 1, which is resulted from movement of the magnetic generating element.

When the magnetic generating element 2 moves in, for example, a rightward direction in FIG. 3, the waveform of the detection signals plotted in FIG. 4 will shift from the waveform shown by the solid line in FIG. 5 to such a waveform as shown by the broken line in FIG. 5 and consequent upon this shift, the zero-crossing position X0, calculated by the calculation processing circuit 6 as the position of the magnetic generating element 2, changes. Therefore, the position of the magnetic generating element 2 then moving linearly, that is, the position to which the movable side member 12 is moved, can be detected as the absolute position on a non-contact basis while avoiding frictional wear involved.

In this magnetic line-type position-angle detecting device, since using the plural signals of the detection signals from the magnetic line sensor 1, which are in the vicinity of zero, the collinear approximation is carried out to determine the zero-crossing position X0, the position of the magnetic generating element 2 can be detected with higher resolution than the array pitch of the magnetic sensor elements 1a of the magnetic line sensor 1 and without being affected by the absolute value (intensity) of the magnetic field strength. Also, since the collinear approximation is calculated using the plural detection signals in the vicinity of zero, noise components contained in those detection signals can be averaged and, hence, such an effect as to render it to be hardly affected by noises can be obtained.

Also, since a permanent magnet forming the magnetic generating element 2, the magnetic line sensor 1, a circuit substrate attendant to the magnetic line sensor 1 and casings are sufficient as component parts of the magnetic sensor type position sensor and the number of component parts used is therefore small and since no external correcting circuit is needed, it can be constructed simply and inexpensively.

It is to be noted that in calculating the position of the magnetic generating element 2 in the calculation processing circuit 6, the coordinates of the zero-crossing position X0 determined by the collinear approximation may be outputted after having been converted into an actual position of the magnetic generating element 2. By way of example, a certain position may be stored as a reference position (0) and the position of the magnetic generating element 2 may then be outputted in the form of a position which is +300 µm relative to the reference position. Where such a calculation process is carried out, the calculation processing circuit 6 discussed above has to be provided with a unit for applying the reference position from outside and a nonvolatile memory for the storage of the reference position.

Figure 6:
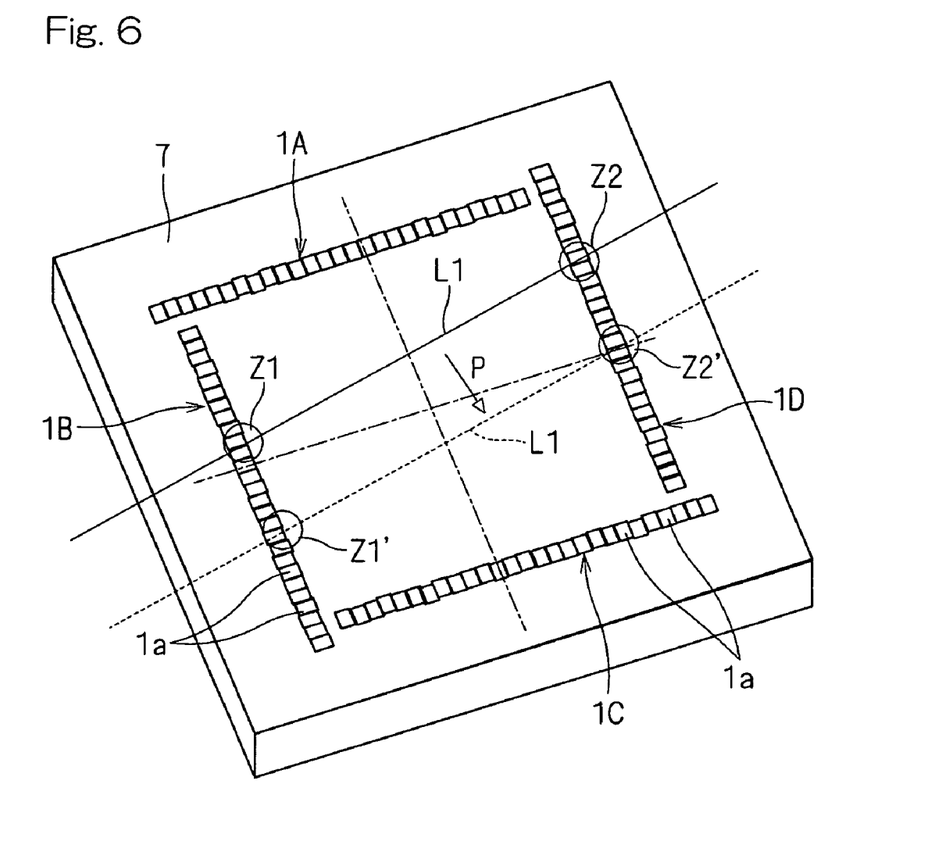
FIG. 6 is a perspective view showing a sensor chip arranged with the magnetic line sensor of a magnetic line-type position-angle detecting devices according to a second preferred embodiment of the present invention.

FIG. 6 illustrates a second preferred embodiment of the present invention. This magnetic line-type position-angle detecting device is similar to that according to the previously described embodiment, but differs therefrom in that four magnetic line sensors 1A to 1D are arranged on the sensor chip 7 in a square pattern as shown therein. In a manner substantially similar to the previously described embodiment, in the vicinity of each of the magnetic line sensors 1A to 1D, the scanning circuit 3 corresponding to the respective magnetic line sensor, the amplifier 4, the AD converting circuit 5 and the calculation processing circuit 6 (all shown in FIG. 2A) are arranged. Although the magnetic generating elements 2 (FIG. 1) is not shown here, the structure thereof is identical with that in the previously described embodiment. It is, however, to be noted that the direction in which the pair of the N and S magnetic poles 2a and 2b of the magnetic generating element 2 are arranged has no particular relation with the direction in which the sensor elements of the magnetic line sensors 1A to 1D are arranged.

This magnetic line-type position-angle detecting device is of a design, in which the magnetic line sensors on each pair of the opposite sides of the square pattern of arrangement of the four magnetic line sensors 1A to 1D, are utilized to determine the angle and the position of movement of the magnetic generating element 2. More specifically, the fact that the boundary position (the zero-crossing position) of the pair of the N and S magnetic poles 2a and 2b of the magnetic generating element 2 lies at respective locations Z1 and Z2 on, for example, the magnetic line sensors 1B and 1D on the opposite sides is calculated by the calculation processing circuits 6, associated with those magnetic line sensors, on the basis of respective detection signals of the magnetic line sensors 1B and 1D and, at the same time, the angle of a zero line L1 connecting the zero-crossing positions Z1 and Z2 and the position of the zero line L1 on the sensor chip 7 are simultaneously determined by the utilization of the coordinates of the zero-crossing positions Z1 and Z2 at two points. The zero line L1 in this case represents a boundary line between N and S magnetic pole regions in the distribution of the magnetic fields emanating from the magnetic generating element 2. Calculation to determine the position and the angle of the zero line L1 from the zero-crossing positions Z1 and Z2 at those two points may be performed either by one of the calculation processing circuits 6 corresponding respectively to the four magnetic line sensors 1A to 1D or by a dedicated calculation processing circuit separately arranged on the sensor chip 7.

In this magnetic line-type position-angle detecting device, when the magnetic generating element 2 moves in, for example, a direction shown by the arrow P in FIG. 6, the zero-crossing positions at those two points detected lie at respective positions Z1' and Z2'. Therefore it is possible to detect the position of the zero line L1 (shown by the broken line in this figure) which has moved from the coordinates of the zero-crossing positions Z1 and Z2.

Also, since the detection of the position and the detection of the angle of the zero line L1 can be accomplished with one set of the sensors, a structure for detecting the linear movement and the rotation of the magnetic generating element 2 can be realized inexpensively and with space-saving.

Figure 7:
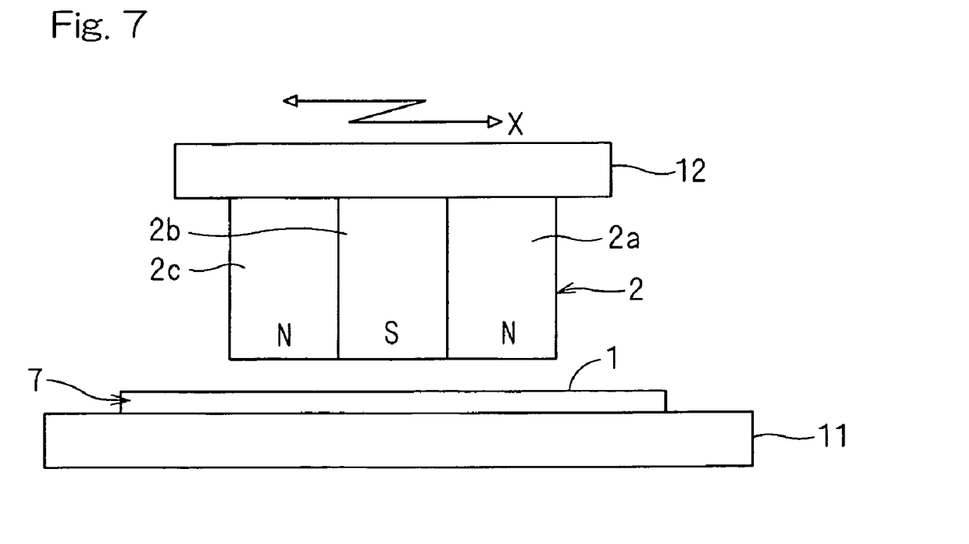
FIG. 7 is a front elevational view showing a basic structure of a magnetic line-type position-angle detecting device according to a third preferred embodiment of the present invention.

A third preferred embodiment of the present invention will now be described with particular reference to FIGS. 7 to 11. FIG. 7 illustrates a basic structure of the magnetic line-type position-angle detecting device according to the third embodiment. This magnetic line-type position-angle detecting device according to the third embodiment differs from the magnetic line-type position-angle detecting device according to the first embodiment only in that the magnetic generating element 2 employed in the third embodiment has two magnetic pole boundaries juxtaposed in a direction in which the sensor elements of the magnetic line sensor are arranged, and other structural features thereof are identical with those in the first embodiment and, therefore, the details thereof are not described for the sake of brevity.

Figure 8:
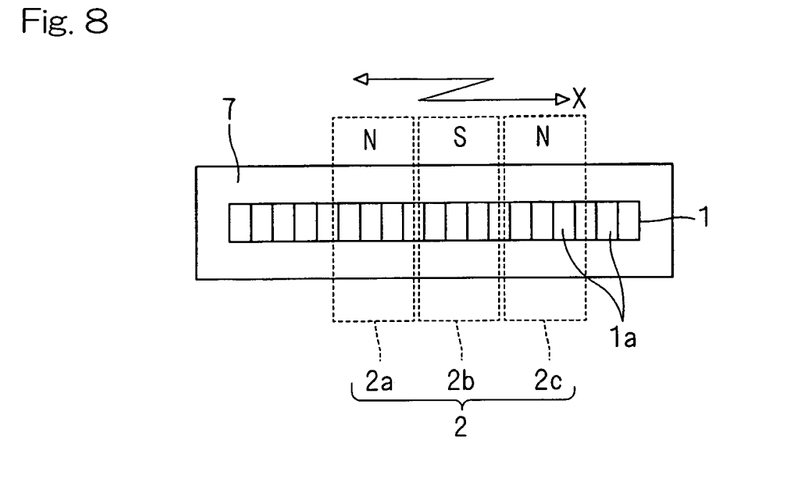
FIG. 8 is a plan view showing a relation in position between a magnet and the magnetic line sensor used in the magnetic line-type position-angle detecting device in FIG. 7.

As shown in FIG. 7, the magnetic generating element 2 has three N, S, and N magnetic poles 2a, 2b, and 2c arranged in this specific order so as to have two magnetic pole boundaries juxtaposed in a direction conforming to the direction X in which the sensor elements are arranged. FIG. 8 is a plan view showing the relation in position between the magnetic line sensor 1 and the magnetic generating element 2.

Figure 9:
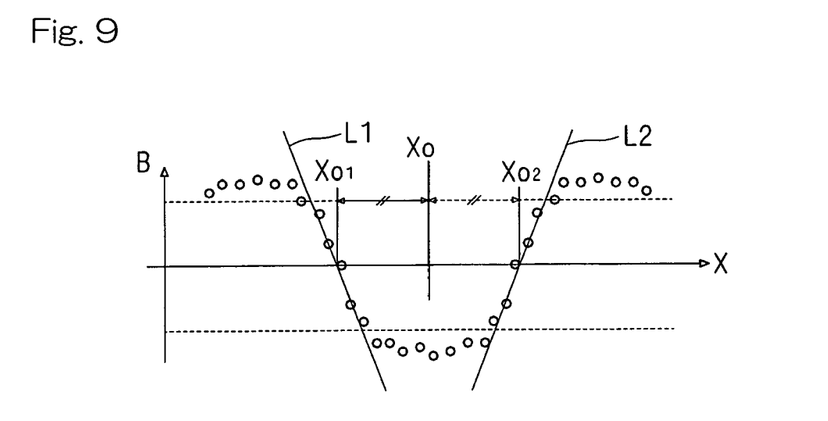
FIG. 9 illustrates a waveform obtained by plotting detection signals from the magnetic line sensor in the magnetic line-type position-angle detecting device in FIG. 7, which are arranged in the order of reading of those detection signals.

Hereinafter, the operation of the above described magnetic line-type position-angle detecting device will be described. In a condition, in which the magnetic generating element 2 is held in, for example, such a relation in position as shown in FIG. 8 relative to the magnetic line sensor 1, a vertical component of magnetic fields generated from the magnetic generating element 2 in a direction perpendicular to the sensor chip 7 is applied to the magnetic line sensor 1 and each of the magnetic sensor elements 1a then detects the magnetic fields so applied. The magnetic sensor elements 1a of the magnetic line sensor 1 are sequentially selected one after another by the scanning circuit 3, and a detection signal from the selected magnetic sensor element 1a is amplified by the amplifier 4, before the output of the amplifier 4 is converted by the AD converting circuit 5 into a digital signal. FIG. 9 is a chart, in which respective detection signals of the magnetic sensor elements 1a obtained through such a signal processing as described above are plotted in the order of reading of those detection signals, which corresponds to a distribution of the magnetic fields generated by the magnetic generating element 2. In this figure, a portion of the waveform on a positive (+) area corresponds to the magnetic fields emanating from the N magnetic poles 2a and 2c of the magnetic generating element 2, whereas a portion of the waveform on a negative (−) area corresponds to the magnetic field emanating from the S magnetic pole 2b of the magnetic generating element 2. A detection signal in the vicinity of a boundary position (zero-crossing position) X01 between the N and S magnetic poles 2a and 2b and a detection signal in the vicinity of a zero-crossing position X02 between the S and N magnetic poles 2b and 2c respectively approximate to a zero output since the vertical components of the magnetic fields applied therefore are zero. In the calculation processing circuit 6, the zero-crossing positions X01 and X02 are calculated from the plural detection signals in the vicinity of zero at those two locations by means of a collinear approximation as shown by linear lines L1 and L2 in FIG. 9, and a point X0 intermediate between the zero-crossing positions X01 and X02 so calculated is then calculated and determined as the position of the magnetic generating element 2. For the above described collinear approximation, the least square method or the like can be employed.

Figure 10:
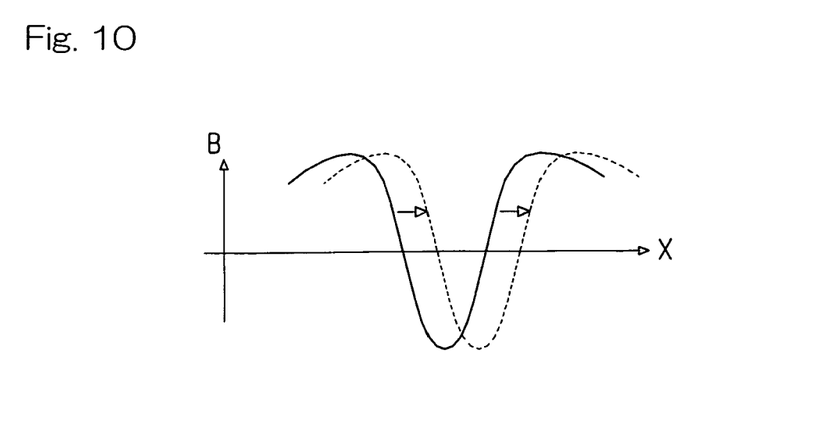
FIG. 10 illustrates a waveform descriptive of a change of the waveform of the detection signal, obtained by the magnetic line-type position-angle detecting device in FIG. 7, which is resulted from movement of the magnetic generating element.

When the magnetic generating element 2 moves in, for example, a rightward direction in FIG. 8, the waveform of the detection signals plotted in FIG. 9 will change from the waveform, shown by the solid line in FIG. 10 to such a waveform as shown by the broken line in FIG. 10 and consequent upon this shift, the position X0, calculated by the calculation processing circuit 6 as the position of the magnetic generating element 2, changes. Therefore, the position of the magnetic generating element 2 then moving linearly, that is, the position to which the movable side member 12 is moved, can be detected as the absolute position on a non-contact basis while avoiding frictional wear involved.

Figure 11:
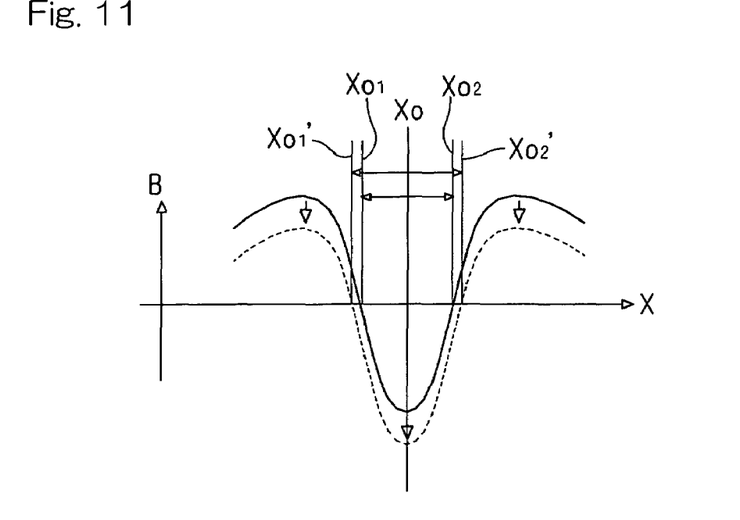
FIG. 11 illustrates a waveform descriptive of a change of the waveform of the detection signal, obtained by the magnetic line-type position-angle detecting device in FIG. 7, which is resulted from disturbing magnetic fields.

Also, the above described waveform of the detection signal will change from the waveform, shown by the solid line in FIG. 11 to such a waveform as shown by the broken line in FIG. 11, when an disturbing magnetic field is applied, and the single zero-crossing positions X01 and X02 are consequently shifted by an equal quantity to respective positions X01' and X02'. In such case, since the shift of the zero-crossing position X01 takes place in an X-axis direction towards the negative (−) side whereas the shift of the zero-crossing position X02 takes place in the X-axis direction towards the positive (+) side, the point X0 intermediate between those two zero-crossing positions X01 and X02 does not change even through the zero-crossing positions have shifted as described above. In other words, the position X0 of the magnetic generating element 2 calculated by the calculation processing circuit 6 is not affected by the disturbing magnetic fields.

In this magnetic sensor type position sensor, the two zero-crossing positions X01 and X02 are determined by means of the collinear approximation of the plural signals in the vicinity of zero at the two locations out from the detection signals outputted from the magnetic line sensor 1, and the point X0 intermediate between the zero-crossing positions X01 and X02 so determined is calculated for outputting the intermediate point X0 as the position of the magnetic generating element 2. As a result, it is possible to detect the position of the magnetic generating element 2 with higher resolution than the array pitch of the magnetic sensor elements 1a of the magnetic line sensor 1 and without being affected by the absolute value (intensity) of the magnetic field strength and the disturbing magnetic fields. Also, since the collinear approximation is calculated using the plurality of the detection signals in the vicinity of the zero, noise components contained in those detection signals can be averaged, bringing about such an effect as to render it to be hardly affected by noises.

Also, since the magnetic generating element 2, the magnetic line sensor 1, a circuit substrate attendant to the magnetic line sensor 1 and casings are sufficient as component parts of the magnetic sensor type position sensor and the number of component parts used is therefore small and since no external correcting circuit is needed, it can be constructed simply and inexpensively.

It is to be noted that in calculating the position of the magnetic generating element 2 with the calculation processing circuit 6, the coordinates of the zero-crossing position X0 determined in the manner described above may be outputted after having been converted into an actual position of the magnetic generating element 2. By way of example, a certain position may be stored as a reference position (0) and the position of the magnetic generating element 2 may then be outputted in the form of a position which is +300 μm relative to the reference position. Where such a calculation process is carried out, the calculation processing circuit 6 discussed above has to be provided with a unit for applying the reference position from outside and an nonvolatile memory for the storage of the reference position.

Advantages of the magnetic line-type position-angle detecting device according to any one of the first to third embodiments are summarized as follows:

(1) Detection is possible on a non-contact basis. For this reason, a problem associated with the frictional wear is avoided.

(2) Since a plurality of the minute magnetic sensor elements 1a are arranged in a plural number, it is possible to accomplish a position detection with high resolution.

(3) Since the structure of the device includes the magnetic generating element 2, the magnetic line sensor 1, the circuit substrate and the casings, the number of component parts used is small and no external correcting circuit is needed.

(4) The absolute position can be detected.

(5) Because of the system of detecting the zero-crossing position, the position detection can be accomplished without being affected even when a gap between the magnetic generating element 2 and the magnetic line sensor 1 changes and the magnetic field strength changes. Where the zero-crossing position is detected by means of the collinear approximation in the vicinity of zero, it is possible to detect the position with higher resolution than the array pitch of the magnetic sensor elements 1a.

Figure 12:
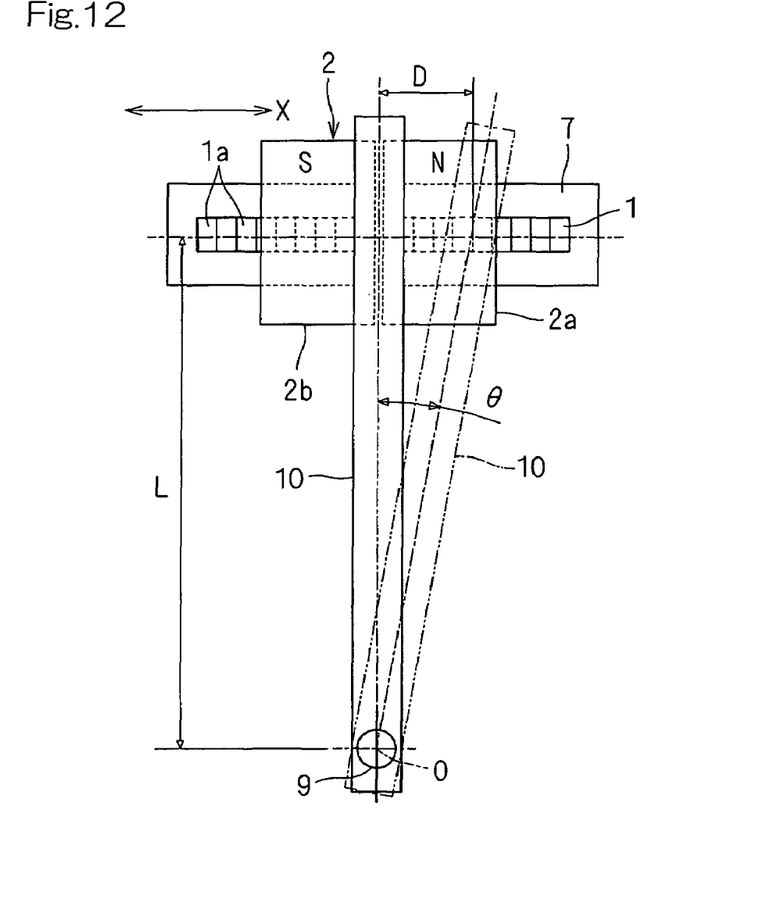
FIG. 12 is a plan view showing a basic structure of a magnetic line-type position-angle detecting device according to a fourth preferred embodiment of the present invention.
Figure 13:
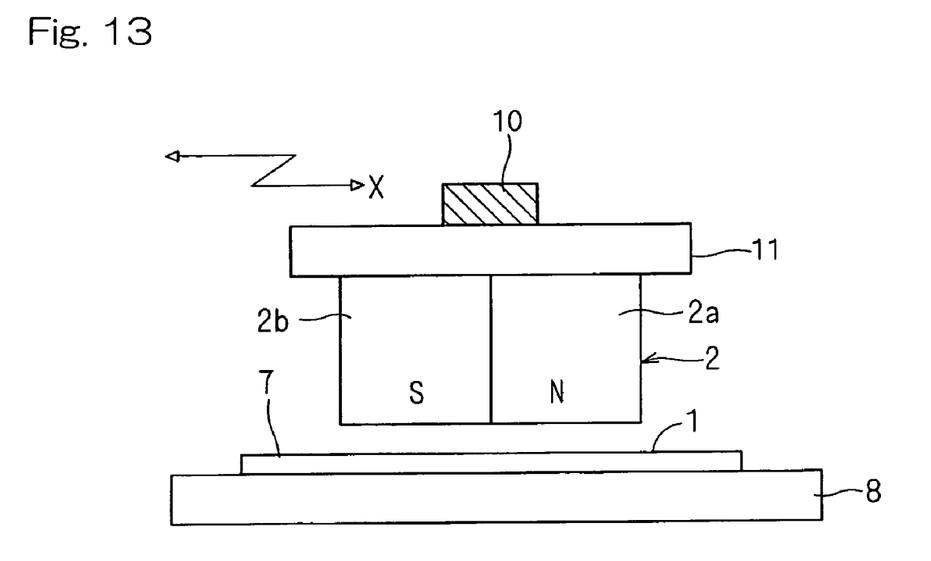
FIG. 13 is a front sectional view of the magnetic line-type position-angle detecting device in FIG. 12.
Figure 14:
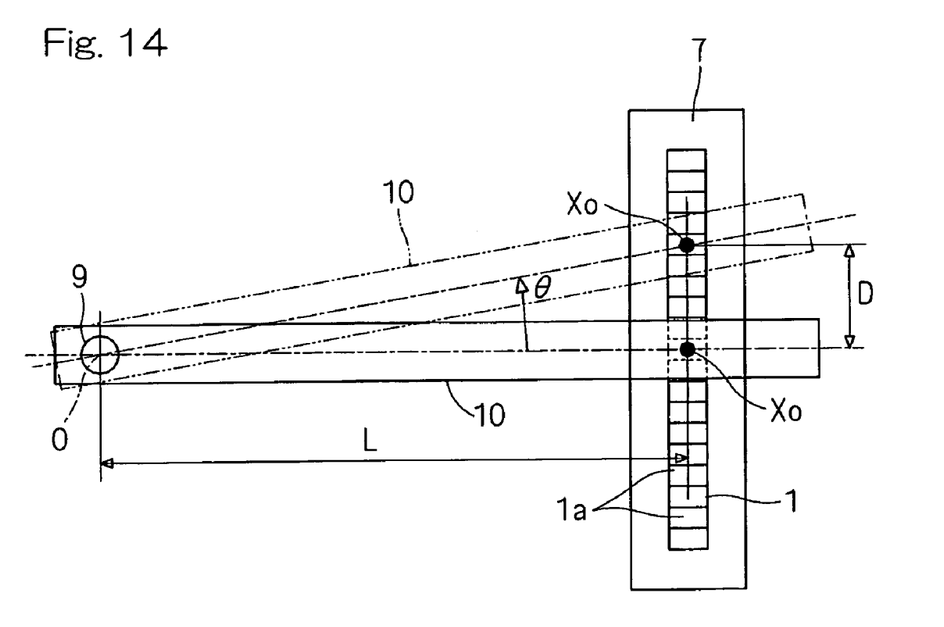
FIG. 14 is an explanatory diagram showing an angle calculating process performed in a calculation processing circuit used in the magnetic line-type position-angle detecting device in FIG. 12.

A fourth preferred embodiment of the present invention will now be described with particular reference to FIGS. 12 to 14. The basis structure of a magnetic line-type position-angle detecting device is shown in a plan view in FIG. 12 and in a front sectional view in FIG. 13. Referring to FIG. 12, the magnetic line-type position-angle detecting device includes a magnetic line sensor 1 having a plurality of magnetic sensor elements 1a arranged in a linear array, and a magnetic generating element 2 held in face-to-face relation with the magnetic line sensor 1 on a non-contact basis and angularly movable generally along the magnetic line sensor 1 in a direction, conforming to the direction X in which the magnetic sensor elements 1a are deployed, on an arcuate path about a predetermined rotation axis O. The magnetic line sensor 1 is provided on a silicon chip 7 as one of integrated circuit components, which chip 7 is fixed on a stationary side member 8 as shown in FIG. 13. The magnetic generating element 2 is fitted through a magnet support base 11, as shown in FIG. 13, to a free end of a swing arm 10 having a base end, that is rotatably supported on the stationary side member 8 through a pivot shaft 9 defining the rotation axis O as shown in FIG. 12, so that the magnetic generating element 2 can swing and move together with the swing arm 10. It is to be noted that the magnet support base 11 is omitted in FIG. 12.

Even with the fourth embodiment, in a manner substantially similar to the previously described first embodiment, the waveform of the detection signals plotted in FIG. 4 will shift from the waveform, shown by the solid line in FIG. 5 to such a waveform as shown by the broken line in FIG. 5 when the magnetic generating element 2 moves in, for example, a rightward direction in FIG. 3, and consequent upon this shift, calculation to determine the angle at the position of the magnetic generating element 2 calculated by the calculation processing circuit 6 as the zero-crossing position is carried out in the following manner. FIG. 14 is an explanatory diagram of the angle calculating process referred to above. In this figure, assuming that a detection position X0 of the magnetic generating element 2 when the swing arm 10 is held at a swing position shown by the solid line is the position of the origin, and when the position of the magnetic generating element 2 changes to the detection position X0 when the swing arm 10 is held at a swing position shown by the chain line, the calculation processing circuit 6 calculates a swing angle θ of the magnet 6 as represented by the following equation:

$$\theta = \tan^{-1}(D/L)$$

wherein:

L: the distance from the detection position X0 of the magnetic generating element 2 at the position of the origin of the swinging motion to the axis O of swing, and D: the distance from the detection position X0 of the magnetic generating element 2 at the position of the origin of the swinging motion to a detection position X0 after the swinging motion.

In this way, the swing angle θ of the magnetic generating element 2 can be detected on a non-contact basis while avoiding frictional wear.

It is to be noted that the calculation processing circuit 6 has a parameter storage (not shown) for storing various parameters required to accomplish the above described calculation such as, for example, the distance L of arrangement of the magnetic generating element 2 from the axis O of swing, and the position of origin (the position of origin of the swinging motion) of the angle of the magnetic generating element 2. This parameter storage is of a type in which those parameters to be stored can be set from outside of the calculation processing circuit 6.

Since the swing angle θ of the magnetic generating element 2 is determined by means of the calculation processing as described above, the resolution of detection of the position is limited by the structure of the sensor elements 1a of the magnetic line sensor 1 and noise characteristics, but increase of the distance L, from the detection position X0 of the magnetic generating element 2 at a reference swing position to the axis O of swing, is effective to accomplish the detection of a minute angle with high accuracy. By way of example, if the position detecting precision is 10 μm, the angle resolution will be 0.57 degree when L=1 mm, but will be 0.057 degree when L=10 mm. It is, however, to be noted that increase of the distance L reduces the detachable range of angle and, therefore, this magnetic line sensor type angle detecting device is particularly suited to the detection with high resolution within a certain range of angle.

Also, since the magnetic line sensor 1 is of a system of detecting the zero-crossing position, the zero-crossing position is not affected by changes in the sensitivity of the magnetic sensor elements 1a and the magnetic field strength and, therefore, the stable detection of the position is possible. Accordingly, there is no need to control the gap distance between the magnetic line sensor 1 and the magnetic generating element 2, and assemblage and adjustment can therefore be accomplished easily This magnetic line-type position-angle detecting device may suffice to include the small number of component parts such as the magnetic generating element 2, the silicon chip 7 having the magnetic line sensor 1 and the various signal processing circuits 3 to 6 integrated thereon, a circuit substrate attendant to the silicon chip 7 and casings, and, no external correcting circuit is needed. Therefore the structure can be constructed simple and compact.

Advantages of the fourth embodiment described above are summarized as follows:

(1) Detection of the angle with high resolution can be accomplished with a simplified structure.

(2) Since the magnetic line sensor 1 and the processing circuit can be integrated together, the detecting device can have a compact structure.

(3) Since the component parts are integrated on the silicon chip, it is inexpensive.

(4) The resolution can be increased with increase of the distance of arrangement from the rotation axis.

(5) Because of the system of detecting the zero-crossing position, the position detection can be accomplished without being affected by a change in the gap distance of arrangement between the magnetic generating element 2 and the sensor 1.

Figure 15:
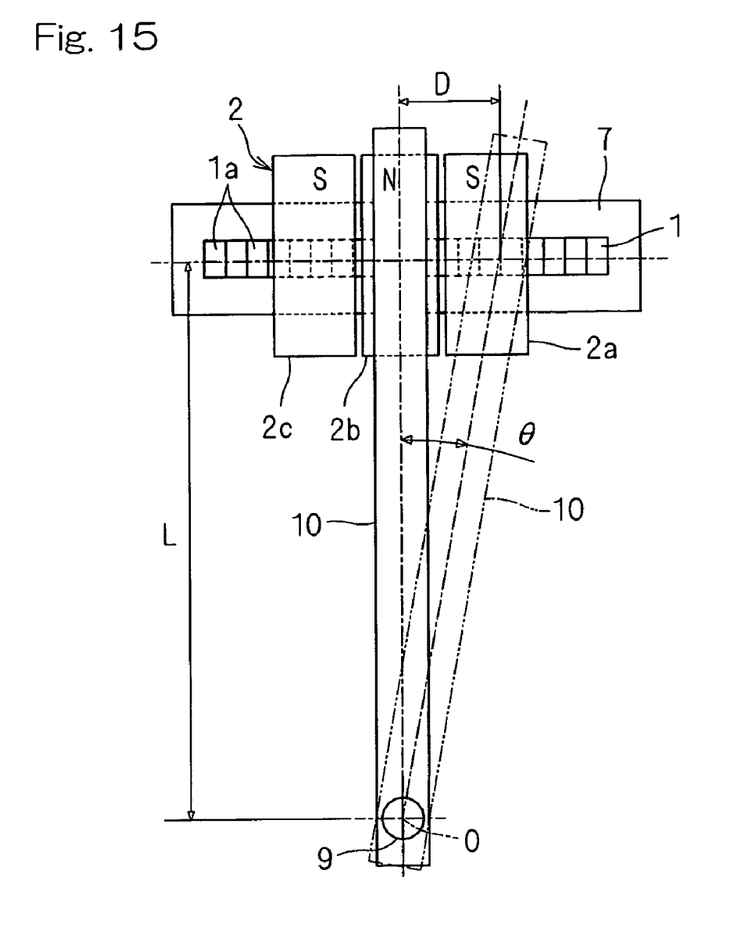
FIG. 15 is a plan view showing a basic structure of a magnetic line-type position-angle detecting device according to a fifth preferred embodiment of the present invention.

A fifth preferred embodiment of the present invention is shown in FIG. 15. The magnetic line-type position-angle detecting device according to this fifth embodiment is similar to the previously described fourth embodiment shown in FIGS. 12 to 14, but differs therefrom in that the magnetic generating element 2 employed in the fifth embodiment makes use of three of S, N and S magnetic poles 2a, 2b and 2c, arranged in this specific order, so that the magnetic generating element 2 can have two magnetic pole boundaries juxtaposed in a direction conforming to the direction X, in which the magnetic sensor elements 1a of the magnetic line sensor 1 are arranged. Other structural features thereof are similar to those in the previously described embodiment unless otherwise specified.

Figure 16:
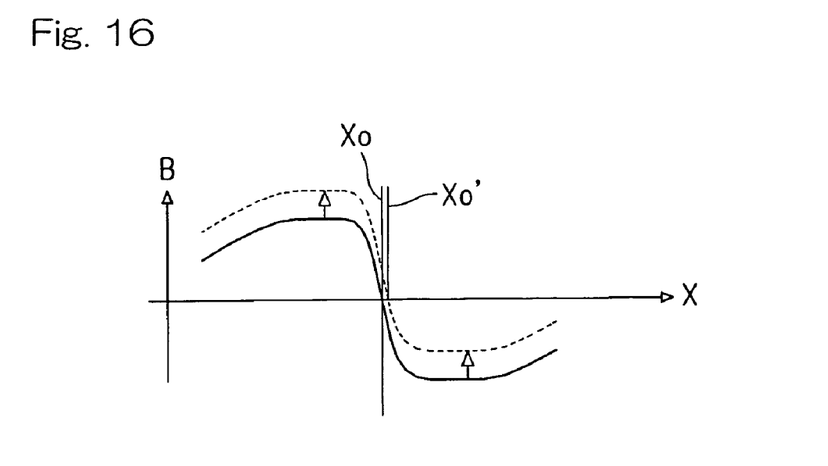
FIG. 16 illustrates a waveform descriptive of a change of the waveform of the detection signal, obtained by the magnetic line-type position-angle detecting device according to the fourth embodiment, which is resulted from disturbing magnetic fields.

Incidentally, where the magnetic generating element is of a type having the pair of N and S magnetic poles 2a and 2b as is the case with the previously described fourth embodiment, when an disturbing magnetic field is applied, a magnetic field signal detected by the magnetic line sensor 1 changes from a condition shown by the solid line in FIG. 16 to a condition shown by the broken line in FIG. 16. As a result, the position detected becomes inaccurate, due to a shift of the detected zero-crossing position X0 to X0'. The fifth embodiment described above is effective to eliminate such inconveniences.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

What is claimed is:

1. A magnetic line-type position-angle detecting device comprising:
   a magnetic line sensor having a plurality of magnetic sensor elements arranged in a linear array;
   a magnetic generating element held in face-to-face relation with the magnetic line sensor and movable along the magnetic line sensor in a direction conforming to the direction in which the magnetic sensor elements are deployed;
   a scanning circuit to sequentially select one of the magnetic sensor elements of the magnetic line sensor;
   an amplifier to amplify a signal outputted from the selected sensor element;
   an analog-to-digital converting circuit to convert an output from the amplifier into a digital signal; and
   a calculation processing circuit to evaluate a distribution of magnetic fields, applied to the magnetic line sensor, in reference to an output of the analog-to-digital converting circuit to thereby calculate a position and/or an angle of the magnetic generating element,
   wherein the calculation processing circuit is capable of detecting a zero-crossing position of a waveform of a sensor signal outputted from the analog-to-digital converting circuit,
   wherein the magnetic generating element has two magnetic pole boundaries in a direction in which the sensor elements of the magnetic line sensor are arranged, and
   wherein the calculation processing circuit is capable of detecting the position of the magnetic generating element by detecting two zero-crossing positions obtained from a waveform of the sensor signal outputted from the analog-to-digital converting circuit.

2. The magnetic line-type position-angle detecting device as claimed in claim 1, wherein the magnetic generating element includes a magnet having three N, S and N magnetic poles or three S, N and S magnetic poles confronting the magnetic line sensor and arranged in this specific order so as to have the two magnetic pole boundaries, and the calculation processing circuit is capable of detecting the position of the magnetic generating element in reference to a waveform of a sensor signal obtained from the output of the analog-to-digital converting circuit.

3. The magnetic line-type position-angle detecting device as claimed in claim 1, wherein the calculation processing circuit is capable of converting the zero-crossing position into an actual position of the magnetic generating element to thereby calculate and output an absolute position.

4. The magnetic line-type position-angle detecting device as claimed in claim 1, wherein the calculation processing circuit is capable of determining an intermediate point from the two detected zero-crossing positions for outputting the detected position of the magnetic generating element.

5. The magnetic line-type position-angle detecting device as claimed in claim 1, wherein the magnetic line sensor comprises four magnetic line sensors, and
   the four magnetic line sensors are arranged in a square form and the calculation processing circuit is capable of detecting the angle and the position of the magnetic generating element simultaneously.

6. The magnetic line-type position-angle detecting device as claimed in claim 1, wherein the magnetic generating element is angularly movable generally along the magnetic line sensor in a direction, conforming to the direction in which the magnetic sensor elements are deployed, on an arcuate path about a predetermined rotation axis and the calculation processing circuit is capable of measuring a distribution of magnetic fields applied to the magnetic line sensor for detecting the position of the magnetic generating element above the line sensor, and capable of determining from the detected position, an angle at which the magnetic generating element is positioned about the rotation axis.

7. The magnetic line-type position-angle detecting device as claimed in claim 6, wherein the calculation processing circuit includes a parameter storage for storing such parameters as a distance of arrangement of the magnetic generating element from the rotation axis and a position of origin of the angle of the magnetic generating element and wherein the parameters to be stored in the parameter storage can be set from outside of the calculation processing circuit.

8. The magnetic line-type position-angle detecting device as claimed in claim 7, wherein the calculation processing circuit is capable of detecting the position of the magnetic generating element above the magnetic line sensor, by utilizing the parameters stored in the parameter storage, to thereby calculate an absolute angle from the detected position data.

* * * * *